United States Patent
Kim et al.

(10) Patent No.: US 6,506,680 B1
(45) Date of Patent: Jan. 14, 2003

(54) METHOD OF FORMING CONNECTIONS WITH LOW DIELECTRIC INSULATING LAYERS

(75) Inventors: Il-Goo Kim, Songnam (KR); Jae-Sung Hwang, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 19 days.

(21) Appl. No.: 09/649,020

(22) Filed: Aug. 28, 2000

(30) Foreign Application Priority Data

Aug. 28, 1999 (KR) ........................... 99-0036165

(51) Int. Cl.[7] ............................................. H01L 21/00
(52) U.S. Cl. ................... 438/692; 216/67; 216/79; 438/723; 438/734; 438/740
(58) Field of Search ................... 438/691, 692, 438/693, 723, 734, 737, 740, 743; 216/38, 88, 89, 67, 79; 156/345 LP

(56) References Cited

U.S. PATENT DOCUMENTS 6,121,145 A * 9/2000 Huang ........................ 438/692
6,211,092 B1 * 4/2001 Tang et al. ............. 438/723 X
6,251,789 B1 * 6/2001 Wilson et al.

* cited by examiner

*Primary Examiner*—William A. Powell
(74) *Attorney, Agent, or Firm*—Lee & Sterba, P.C.

(57) ABSTRACT

In a semiconductor manufacturing method, etching control is provided by introducing a material containing a material having at least one of an —H, —C, —CH, —$CH_2$, and —$CH_3$ radical component, e.g., Si—O—C, in a lower portion or layer of a dielectric layer formed during a semiconductor manufacturing process. A semiconductor device made by the method includes a first dielectric layer of a material having a given amount of carbon formed on the semiconductor substrate, and a second dielectric layer of a material having a lesser amount of carbon formed on said first dielectric layer wherein the second dielectric layer has an etched pattern formed by etching the second dielectric layer to a depth determined by etching resistance of first dielectric layer. Aspects of invention are particularly useful for making a dual or single damascene structure in a semiconductor device where better control of etching depth is required for via holes and conductive lines in the semiconductor structure.

46 Claims, 6 Drawing Sheets

METHOD OF FORMING CONNECTIONS WITH LOW DIELECTRIC INSULATING LAYERS

BACKGROUND OF THE INVENTION

1. Field of the Invention

The present invention relates to a semiconductor manufacturing method, and more particularly to a method of forming dual-damascene metallic interconnections with low dielectric constant insulating layers.

2. Description of the Related Art

As the semiconductor device packing density increases, performance in speed tends to degrade. Degradation can be caused by increased resistance and parasitic capacitance of the metal interconnections. In particular, devices made according to design rules of 0.25 $\mu$m or less suffer greater speed degradation due to the resistance and capacitance of the interconnections. Even a reduction of gate length does not significantly improve speed in this situation. One proposed solution is to use copper (Cu), instead of aluminum (Al) for metallization since the electrical resistance of Cu is about one third of that of Al.

In devices wherein the metal interconnection is structured in a multilevel fashion, resulting in an increased aspect ratio of contact holes, the device further suffers from non-flatness (non-uniformity or surface irregularities), bad step coverage, residual metal short-circuits, low yield rate, degraded reliability, etc. It is, however, known to use a damascene process to resolve some of these problems. The damascene process comprises the steps of etching an insulating layer to form trenches, depositing a metal layer in and over the trenches, and removing the excessive metal layer by chemical mechanical polishing (CMP), so that the metal interconnections are arranged in a line and space pattern embedded in the trenches. A dual damascene process advantageously fills via-holes or contact holes simultaneously during metallization.

FIG. 1 is a cross sectional view illustrating the step of forming a via-hole in a previously formed trench using a dual-damascene process. Referring to FIG. 1, a lower metal interconnection layer 10 comprising or consisting of Al, Cu or Al—Cu alloy is deposited on a semiconductor substrate (not shown) covered with an insulating layer. Deposited over the lower metal interconnection layer is an oxide layer that forms an inter-metal dielectric layer (IMD) 12. The IMD layer 12 is etched by a photolithographic process to form the trench 14, over which is laid a photoresist pattern 16 to define the contact hole. The IMD 12 layer is etched according to the photoresist pattern 16 to form the contact hole 18, thereby exposing the lower metal interconnection layer 10.

Problems encountered in the conventional process include non-uniformity of the trench depth and formation of micro-trenches which appear towards the sidewalls at the bottom of the trench, which is caused by using the time-etching process without selectivity. In addition, as the trench depth is increased, it becomes more difficult to use a photolithographic process to define the contact hole. For example, if the trench depth is 15000Å, and the thickness of the photoresist defining the contact hole is 1 $\mu$m, the thickness of the photoresist in the trench becomes about 2.5 $\mu$m due to the photoresist filling the trench. In such a case, the photoresist in the trench region may not be sufficiently exposed to light during a subsequent exposing step, and the high step between the trench and the other regions causes irregular light reflection, distorting the profile of the contact hole.

To resolve the above problems, a proposed dual damascene process is employed to form first the contact hole before the step of producing the trench and the step of a single-damascene process comprising filling the contact hole and metallization. However, the single-damascene process requires chemical mechanical polishing (CMP) separately for each of the steps of forming the contact-hole plug and metallization. The conventional dual-damascene process is described below.

FIG. 2 illustrates a conventional self-aligned dual damascene (SADD) process where an oxide layer is deposited on a lower metal interconnection layer 20 to form a lower insulating interlayer 22. Layer 22 is subsequently covered by a nitride layer 24 to serve as an etching stopper layer, which is etched to define the region of the contact hole. Deposited over it is an oxide layer to form an upper insulating interlayer 26, which is covered by a photoresist pattern 28 to define the trench region. The upper insulating interlayer 26 is etched with high selectivity to the etching stopper layer 24 to form the trench 30 according to the photoresist pattern 28. Removing the photoresist pattern 28, the lower insulating interlayer 22 is etched using the etching stopper layer 24 as a mask to form the contact hole 32, exposing the lower metal interconnection layer 20.

Although the above-described SADD process achieves uniformity of the trench depth, and prevents micro-trenches from being generated because of etching the trench with high selectivity to the etching stopper layer of nitride, it inevitably increases the parasitic capacitance of the metal interconnections because the nitride layer has a high dielectric constant.

FIG. 3 illustrates a conventional couter-bore dual damascene (CBDD) process, where an oxide layer is deposited on a lower metal interconnection layer 40 to form a lower insulating interlayer 42, on which is deposited a nitride layer to an etching stopper layer 44, on which is deposited an oxide layer to form an upper insulating interlayer 46. The substrate is subjected to a photolithographic process to sequentially etch the upper insulating interlayer 46, etching stopper layer 44, and lower insulating interlayer 42 so as to form the contact hole 48, exposing the lower metal interconnection layer 40. Deposited over it is a photoresist pattern 50 to etch the upper insulating interlayer 46 with high selectivity to the etching stopper layer 44 to form the trench 52. This process also increases the parasitic capacitance among the metal interconnections due to the nitride stopper layer having high dielectric constant.

FIG. 4 illustrates another conventional CBDD process in which an oxide layer is deposited on a lower metal interconnection layer 60 to form an insulating interlayer 62, which is subjected photolithographic process to etch the contact hole 64 exposing the lower metal interconnection layer. Deposited on it is a photoresist, etched back. The contact hole 64 is filled with the photoresist 66. Formed over the insulating interlayer 62 is a photoresist pattern 68 to etch the insulating interlayer 62 to form the trench 70 with a predetermined depth. Finally, the photoresist pattern 68 and the photoresist 66 filling the contact hole 64 are removed. Although this process does not increase the parasitic capacitance of the metal interconnections because of etching the trench by using the photoresist instead of a nitride layer, this process requires an additional step of filling the trench with photoresist, and does not secure uniformity of the trench depth because of the lack of an etching stopper layer like a nitride layer used in the insulating interlayer.

SUMMARY OF THE INVENTION

It is an object of the present invention to provide a method of forming metal interconnections in a semiconductor device by selectively etching trenches with the help of low dielectric constant insulating layers for the damascene process.

According to an aspect of the present invention, a method of forming metal interconnections in a semiconductor device comprises the steps of depositing a first, lower insulating layer having a low dielectric constant over a semiconductor substrate provided with a metal interconnection layer; depositing over the first insulating interlayer a second, upper insulating layer having a low dielectric constant and a higher etching rate than the first insulating layer; etching the upper and lower insulating interlayers according to a first photoresist pattern formed on the upper insulating interlayer so as to produce contact holes exposing the lower metal interconnection layer; removing the photoresist pattern; and etching the upper insulating interlayer with selectivity to the lower insulating interlayer according to a second photoresist pattern formed over the upper insulating interlayer so as to produce trenches for forming an upper metal interconnection layer. The second dielectric layer comprises one of a SiO2, HSQ, USG, BPSG, BSG, and PSG layer.

Preferably, the first insulating layer comprises an organic or inorganic substance with a hydrogen radical (—H) or bond with a carbon compound or a multi-layer structure containing this substance, and the second insulating layer comprises an inorganic substance without (or a lesser amount of) the hydrogen radical and bond with a carbon compound, or otherwise, the first insulating layer comprises an organic substance or a multi-layer structure containing the same, and the second insulating layer comprises an inorganic substance.

Preferably, the step of etching the upper insulating layer with selectivity to the lower insulating interlayer is performed using a plasma gas of CxFy series (where x and y are compatible integers) with a high C/F ratio, a mixture of CxFy/CHxFy series, or CxFy or CHxFy/CxFy series mixed with at least one of $O_2$, $N_2$, or CO.

The upper insulating interlayer having a faster etching speed is etched with high selectivity to the lower insulating interlayer with a slower etching speed to form the trench, thus achieving uniformity of the trench depth and preventing micro-trenches from being produced in the sidewalls near the bottom of the trench. In addition, the insulating interlayer of low dielectric constant reduces the parasitic capacitance among the metal interconnections, thereby improving the circuit performance.

According to another aspect of the invention, a method of etching a dielectric layer to a given depth comprises providing a semiconductor substrate; forming a barrier layer on said substrate; forming on the barrier layer a first dielectric layer containing an amount X of carbon; forming on the first dielectric layer a second dielectric layer containing an amount Y of carbon, where Y is between zero and less than X; forming a plurality of photoresist patterns on the second dielectric layer; patterning the second dielectric layer using an etching process to expose regions of the first dielectric layer; removing the first photoresist by at least one of an ashing and a strip process; forming a second photoresist on the second dielectric layer and exposed regions of the first dielectric layer; forming contact holes in the exposed regions of the first dielectric layer covered by the second photoresist using a photoetching process; removing the second photoresist by at least one of an ashing and a strip process thereby to form a dual damascene pattern in the first and second dielectric layers; and filling in the dual damascene pattern with a conductive material. By specifying carbon, it is meant to include a radical contain a carbon element.

According to another aspect of the invention, a method of forming a multi-layer dielectric structure during semiconductor manufacturing excluding use of an etch stopping layer comprises providing a semiconductor substrate having a plurality of copper lines; forming a copper barrier layer on the copper lines; forming on the copper lines a first insulating layer which contains X amount of carbon; forming on the first insulating layer a second insulating layer containing Y amount of carbon, where Y is from zero to less than X; forming a plurality of photoresist patterns on the second insulating layer; patterning the second insulating layer to expose a surface of the first insulating layer; removing the first photoresist by one of an ashing process and a strip process; forming a second photoresist on the first insulating layer and partially exposed second insulating layer; photoetching a plurality of contact holes over the copper lines; removing the second photoresist using one of an ashing process and a strip process thereby to form a dual damascene pattern; and filling in the dual damascene pattern with a conductive material.

According to yet another aspect of the invention, an etching process for use during a semiconductor manufacturing comprises forming a barrier layer on a semiconductor substrate, forming over the barrier layer a dielectric layer including a carbon component at a lower portion thereof that is greater than a carbon component of an upper portion of the dielectric layer, and etching the upper portion of the dielectric layer using the carbon component at the lower portion to retard an etching rate at the lower portion of the dielectric layer. By carbon component, it is meant to include a radical containing a carbon element.

According to yet a further aspect of the invention, there is provided a semiconductor device having a dielectric layer etched to a predetermined depth comprising a semiconductor substrate, a barrier layer, a first dielectric layer formed over the barrier layer and having X amount of carbon, said first layer including via holes formed therein, and a second dielectric layer formed on said first dielectric layer having Y amount of carbon where Y from zero to less than X, said second dielectric layer having a pattern filled with a conductive material that is formed by etching said second dielectric layer to a depth determined by using the amount X of a carbon-containing or other radical contained in the first dielectric layer and filling the etched pattern with a conductive material.

The invention, though, is pointed out with particularity by the appended claims.

The present invention will now be described more specifically with reference to the drawings attached only by way of example.

DETAILED DESCRIPTION OF ILLUSTRATIVE EMBODIMENTS

The subject matter of Korean application No. 1999-36165 filed Aug. 28, 1999, is incorporated herein by reference.

Figure 1:
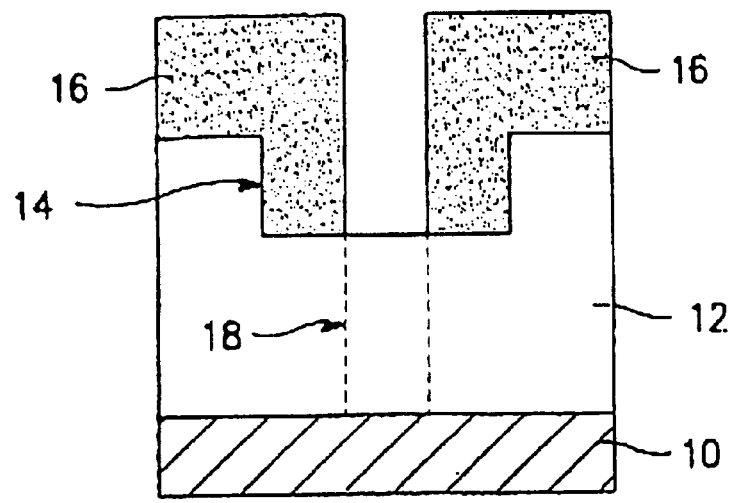
FIG. 1 is a cross sectional view of a semiconductor substrate for illustrating a conventional method for producing contact holes (via-holes) in trenches previously formed by applying the dual damascene process.
Figure 2:
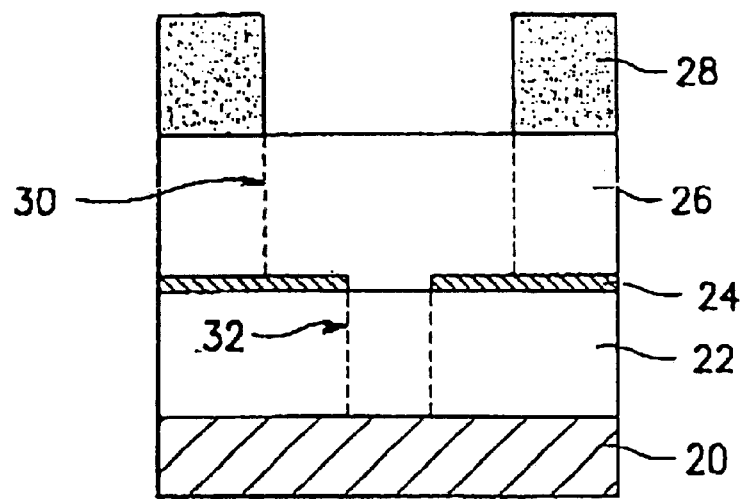
FIGS. 2 to 4 are cross sectional views of semiconductor substrates for illustrating various conventional methods for producing contact holes before forming trenches by applying the exemplary dual damascene process.
Figure 3:
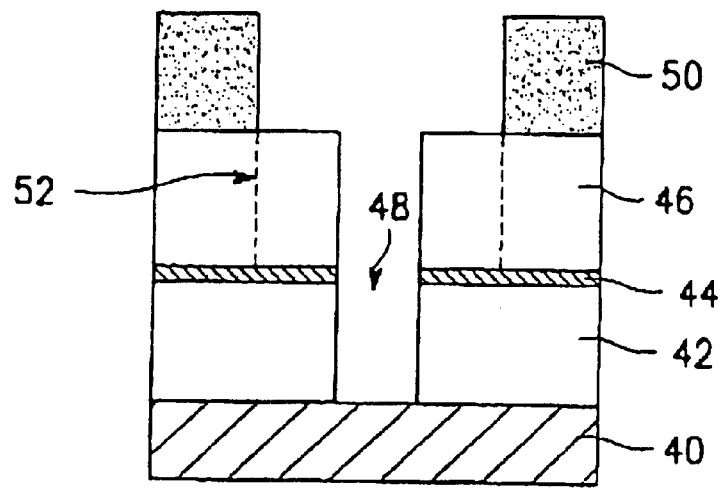
Figure 4:
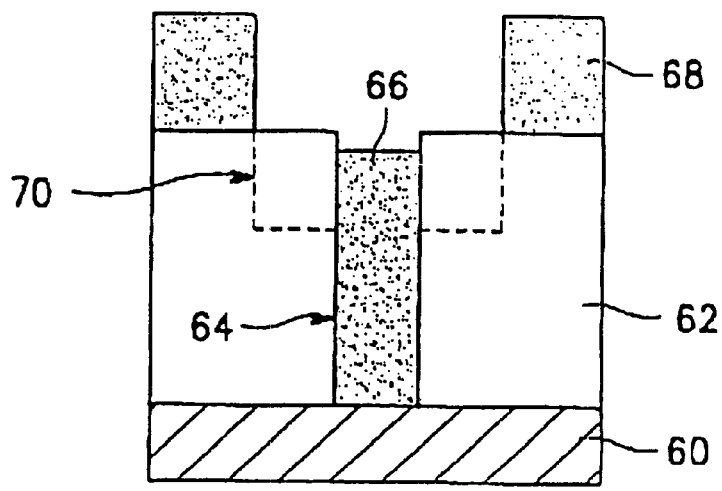
Figure 5:
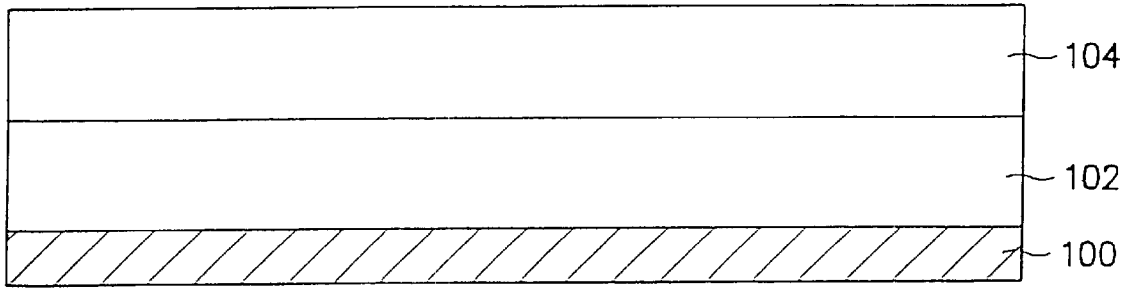
FIGS. 5 to 10 are cross sectional views of a semiconductor substrate for illustrating a method of forming multi-level metal connections by applying an exemplary dual damascene process according to the present invention.

Referring to FIG. 5, an insulating layer (not shown) is deposited over a semiconductor substrate formed with conductive elements such as transistors, bit lines, and plate electrodes of capacitors. Then, sequentially deposited over the insulating layer are a first metal layer consisting of Al, Cu or Al—Cu alloy, and a capping layer consisting of Ti/TiN, which layers are patterned by photolithographic process to produce a lower metal interconnection layer 100.

Deposited over the lower metal interconnection layer 100 is a lower insulating interlayer or dielectric layer 102 comprising an inorganic substance of a low dielectric constant having Si—H, Si—C or Si—CHx bond such as HSQ (hydrosilsequioxane) composed of SiOH with a dielectric constant κ of about 3 or MSQ (methyl-silsequioxane) with Si—CH₃ bond and a dielectric constant κ of about 2.5, or an organic substance with a dielectric constant κ equal to or less than 2.5. The lower insulating interlayer 102 serves as the etching stopper in etching trenches.

Then, deposited over the lower insulating interlayer 102 is an upper insulating interlayer or dielectric layer 104 comprising an inorganic substance of a low dielectric constant without containing Si—H, Si—C and Si—CHx bonds such as FSG composed of SiOF with a dielectric constant κ of about 3.5, SiO₂ with a dielectric constant κ of about 4, or TEOS (tetraethylorthosilicate glass) with a dielectric constant κ=about 3.9. Instead of a complete absence of carbon, the lower layer 102 may contain a material having an amount of Si—H, Si—C and Si—CHx bonds that is lower that the amount in the upper layer 104. In other words, the lower layer contain X amount of such bonds and the upper layer contains Y amount of such bonds, where Y is from zero to less than X.

Generally, an organic or inorganic substance of low dielectric constant containing —H or —CH₃ radicals has a higher etching resistance to plasma of CF series, compared to SiOF or SiO₂. Namely, the etching speed is decreased in layers having radicals —H, —C, —CHx, etc., as follows:

Si—O inorganic substance (SiO₂)>Si—F inorganic substance (FSG)>Si—H inorganic substance (HSQ) >Si—CHx inorganic substance (MSQ)>organic substance. As an example, the radical CHx is CH₃.

Hence, in order to etch the trenches in the upper insulating interlayer 104 and to stop the etching upon reaching the lower insulating interlayer, the upper insulating interlayer 104 should be composed of an insulating layer having a higher etching speed than the lower insulating interlayer 102. For example, with the upper insulating interlayer 104 of SiO₂, TEOS or FSG, the lower insulating interlayer 102 may be composed of HSQ, MSQ or an organic substance. Alternatively, with the upper insulating interlayer 104 of HSQ containing —H, the lower insulating interlayer 102 may be composed of MSQ containing —CHx or another organic substance. Alternatively, with the upper insulating interlayer 104 of MSQ containing —CHx, the lower insulating interlayer 102 may be composed of an organic substance.

Figure 6:
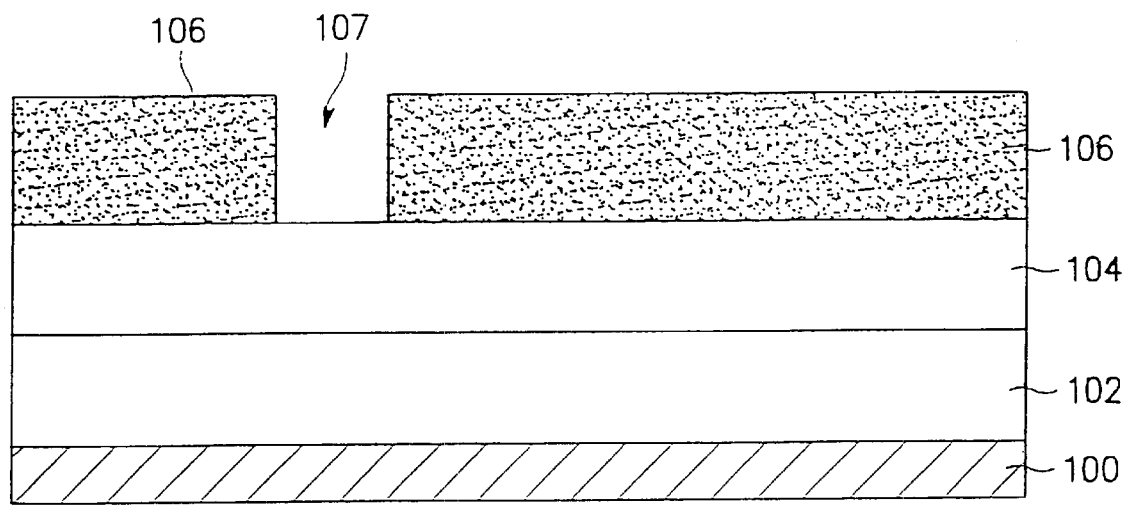
Figure 7:
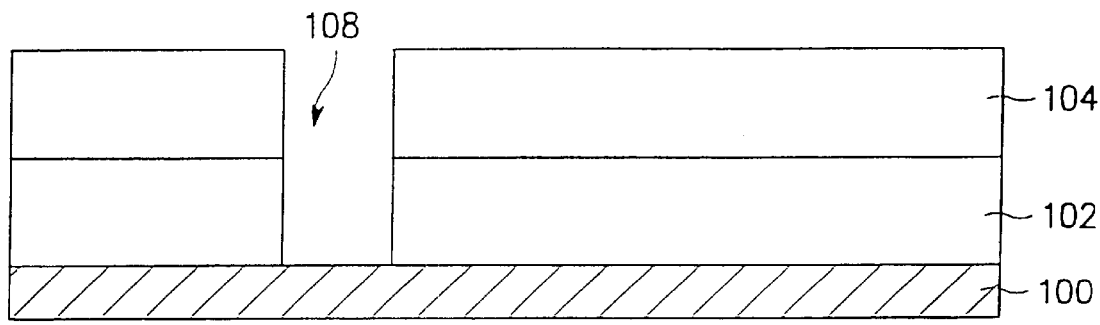

Referring to FIG. 6, a first photoresist pattern 106 is formed over the upper insulating interlayer 104 to define the region for forming the contact hole. According to the first photoresist pattern 106, the upper and lower insulating interlayer 102 and 104 are etched to form the contact hole 108, as shown in FIG. 7. Then, the first photoresist pattern 106 is removed.

Figure 8:
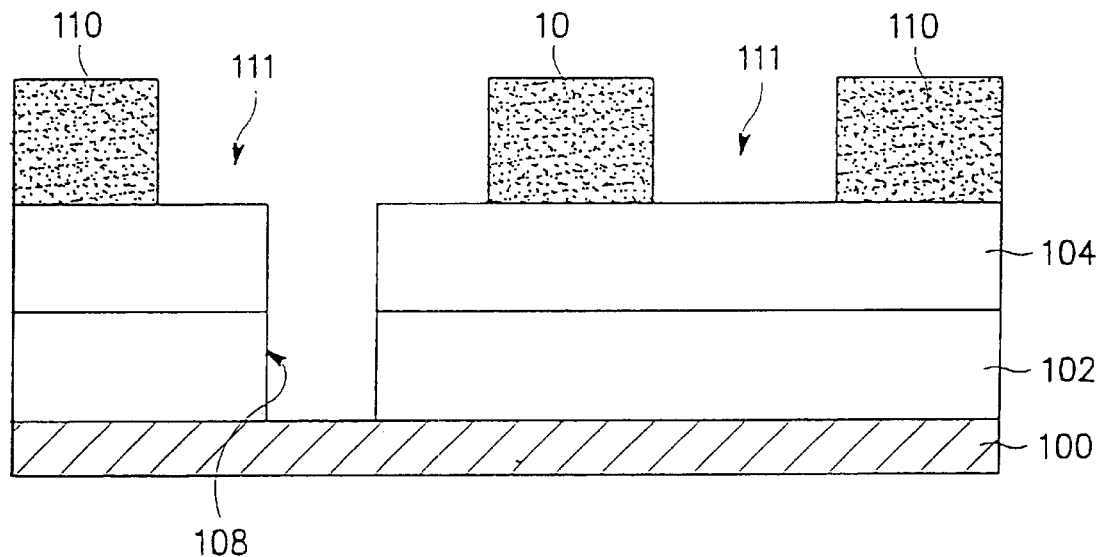

Referring to FIG. 8, deposited over the substrate containing the contact hole 108 is a second photoresist pattern 110 to define regions 111 for forming the trench. According to the second photoresist pattern 110, the upper insulating interlayer 104 is etched with high selectivity to the lower insulating interlayer 102 to form the trench 112 using a plasma gas, to form the resulting structure shown in FIG. 9. Preferably, the plasma gas may be CxFy series with a high C/F ratio such as C₃F₈, C₄F₈, C₅F₈, etc., or a mixture of CxFy series and CHxFy series such as CH₂F₂, CH₃F, etc. Or otherwise, it may be CxFy or CHxFy/CxFy series mixed with at least one of O₂, N₂, or CO. 5. The second dielectric layer preferably comprises one of a SiO2, HSQ, USG, BPSG, BSG, and PSG layer.

Thus, etching the upper insulating layer 104 using a plasma gas of the CxFy or CxFy/CHxFy series, the lower insulating interlayer 102 composed of an organic or inorganic substance such as HSQ and MSQ with an —H, —C or —CHx radical is characterized by a much lower etching speed than an inorganic substance without such —H, —C and —CHx radicals. Hence, substances with an —H, —C or —CHx bond, alone or in combination, are used as an insulating interlayer or dielectric layer to reduce the parasitic capacitance among the metal interconnections and an etch stopper.

Figure 9:
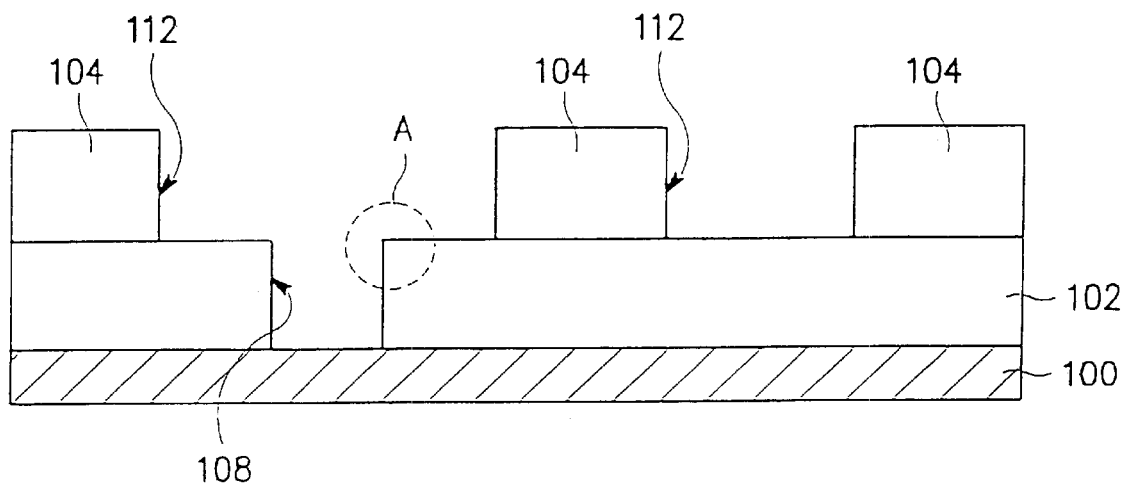
Figure 10:
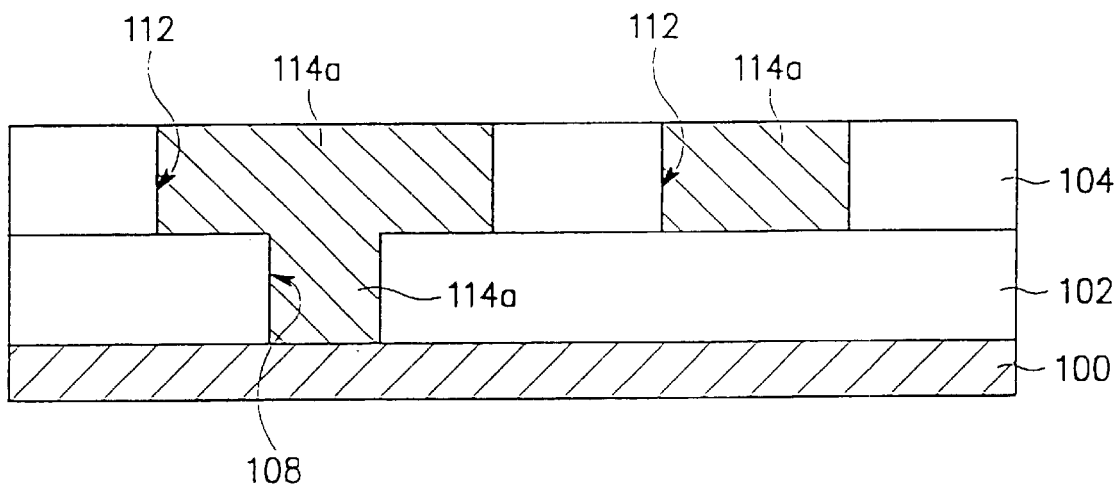

By etching the trench 112 to expose the lower insulating interlayer 102, the organic or inorganic substance with an —H, —C or —CHx bond prevents the profile of the previously formed contact hole 108 from being distorted, thus effectively protecting the fragile shoulder "A" of the contact hole, as shown in FIG. 9. In addition, the lower insulating interlayer 102 serves as the etch stopper to achieve uniformity of the trench depth, and prevents microtrenches from being produced in the sidewalls near the bottom of the trench 112.

After removing the second photoresist pattern 110, a second metal layer such as tungsten, Al, Cu, or Al—Cu alloy is deposited over the substrate with a thickness enough to fill the trench 112 and contact hole 108. Subsequently, the second metal layer is removed by a CMP process to expose the upper insulating interlayer 104, so that the second metal layer forms the contact hole plug 114a within the contact hole 108 and the upper metal interconnection layer 114b within the trench 112.

It can be readily apparent to those skilled in the art that the present embodiment of the invention is applicable to a dual damascene process to first produce contact holes prior to the trench, i.e., the present embodiment can be applicable wherein the sequence is reversed.

Figure 11:
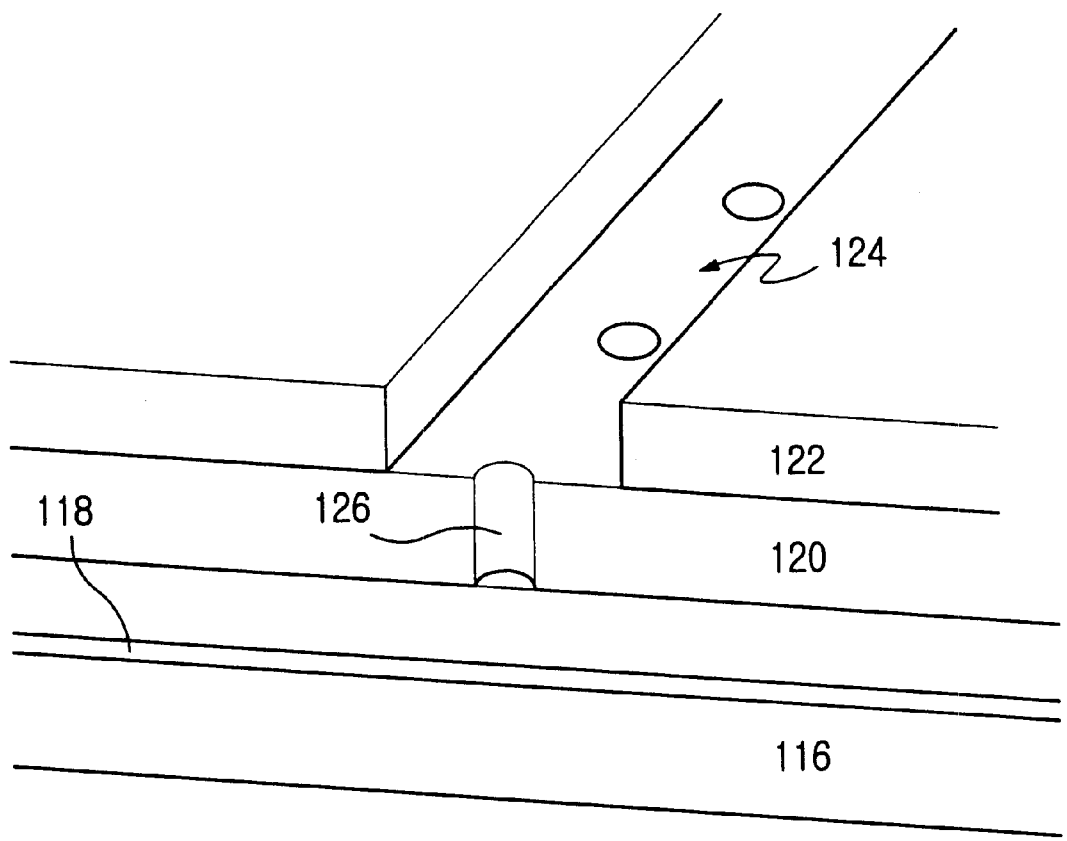
FIG. 11 is a perspective, partial view of a semiconductor device formed using the damascene process of the present invention, wherein a contact structure is previously formed in the substrate.

The damascene process of the invention may also be used where a contact structure is previously formed in the substrate. In this instance, the damascene process is used to form conductors that electrically connect to the contact structure. In FIG. 11, for example, an underlayer or substrate 116 has a barrier layer 118, a first dielectric or insulating layer 120, and a second dielectric or insulating layer 122 formed thereon. The first insulating layer 118 contains an amount X of a material having at least one of an —H, —C, and a $CH_x$, radical and the second insulating layer 122 contains an amount of Y of a material having at least one of an —H, —C, and a $CH_x$ radical, where Y is less than Y. The amount Y may also be zero. Other types of radicals may also alter the etching resistance as described above, in which case the values of X and Y refer to relative amounts of those elements. The values of X and Y differs from integer value of the compounds or radicals described elsewhere in the specifications. As apparent from the structure shown in FIG. 11, contact holes 126 are formed first, and then conductive lines are formed in trench region 124 which lies over the contact holes 126.

Also, the illustrated embodiments may be applied to a single damascene process to produce metal interconnections after the contact holes.

As described above, the upper insulating interlayer with a faster etching speed is etched with high selectivity to the lower insulating interlayer with a slower etching speed to form the trench, thus preventing the profile of the previously formed contact hole from being distorted, thereby obtaining uniformity of the trench depth, and preventing microtrenches from being produced in the sidewalls near the bottom of the trench. In addition, the insulating interlayer of low dielectric constant reduces the parasitic capacitance among the metal interconnections, thereby improving the circuit performance.

While the present invention has been described in connection with specific embodiments accompanied by the attached drawings, it will be readily apparent to those skilled in the art that various changes and modifications may be made thereto without departing from the gist of the present invention.

What is claimed is:

1. A method of etching a dielectric layer to a given depth comprising:

providing a semiconductor substrate;

forming a barrier layer on said substrate;

forming on the barrier layer a first dielectric layer containing an amount X of material having at least one of an —H, —C, —CH, —$CH_2$, and —$CH_3$ radical;

forming on the first dielectric layer a second dielectric layer containing an amount Y of A material having at least one of an —H, —C, —CH, —$CH_2$, and —$CH_3$ radical; where Y is from zero to less than X;

forming a plurality of photoresist patterns on the second dielectric layer;

patterning the second dielectric layer using an etching process to expose regions of the first dielectric layer;

removing the first photoresist by at least one of an ashing and a strip process;

forming a second photoresist on the second dielectric layer and exposed regions of the first dielectric layer;

forming contact holes in the exposed regions of the first dielectric layer covered by the second photoresist using a photoetching process;

removing the second photoresist by at least one of an ashing and a strip process thereby to form a dual damascene pattern in the first and second dielectric layers; and filling in the dual damascene pattern with a conductive material.

2. The method of claim 1, wherein the first dielectric layer includes SiOC, which provides the amount X of a material having at least one of an Si—C, Si—O—C, Si—CH, Si—$CH_2$, and Si—$CH_3$ bond.

3. The method of claim 2, wherein the amount X of a material having at least one of an Si—C, Si—O—C, Si—CH, Si—$CH_2$, and Si—$CH_3$ bond is between 2% and 50% by weight.

4. The method of claim 1, wherein the first dielectric layer is formed by one of a spin-on-dielectric (SOD) process and a chemical vapor deposition (CVD) process.

5. The method of claim 1, wherein the second dielectric layer comprises one of a $SiO_2$, SiOF, USG, BPSG, BSG, and PSG layer.

6. The method of claim 1, wherein a thickness of the first patterning depth is equal to or more than a thickness of the second dielectric layer.

7. The method of claim 1, wherein the contact holes are located over conductive lines in the substrate thereby to provide a conductive path for a contact electrode.

8. The method of claim 7, wherein the contact holes have a given diameter, and the contact holes and the lines overlap between 10% and 99% of the contact hole diameter.

9. The method of claim 7, wherein the diameter of the contact holes is larger than the width of the conductive lines.

10. The method of claim 1, wherein a process condition of the etching process includes gas pressure between 2 and 300 mT, a carrier gases includes at least one of $N_2$, Ar, He, and $H_2$, and an etching gas comprises $C_xH_yF_z$, where x is between one and five, y is between zero and four, and z is between one and eight.

11. The method of claim 10, wherein the etching gas further includes at least one of CO and $O_2$.

12. The method of claim 10, wherein the etch process during formation of the dual damascene layer comprises one of a high density plasma (HDP) method, a reactive ion etching (RIE) method, and a magnetic-enhanced RIE method.

13. The method of claim 1, further including forming conductive lines in the substrate in electrical contact with the contact holes.

14. The method of claim 1, further including the step of planarizing the first dielectric layer before forming the second dielectric layer.

15. A method of forming metal interconnections during semiconductor manufacturing comprising:
    providing a semiconductor substrate having a plurality of copper lines;
    forming a copper barrier layer on the copper lines;
    forming on the copper lines a first insulating layer which contains X amount of a material having a slower etching rate;
    forming on the first insulating layer a second insulating layer containing Y amount of a material having faster etching rate relative to the etching rate of the first insulating layer;
    forming a first photoresist pattern on the second insulating layer;
    etching the first and second insulating layers and the copper barrier layer to produce contact holes for exposing the copper lines;
    removing the first photoresist pattern;
    forming a second photoresist on the first insulating layer;
    etching the second insulating layer with selectivity to the first insulating layer to produce at least one trench;
    removing the second photoresist pattern; and
    filling the contact hole and trench with a conductive material.

16. The method of claim 15, wherein the first insulating layer includes an amount X of a material having at least one of an Si—C, Si—O—C, Si—CH, Si—$CH_2$, and Si—$CH_3$ bond.

17. The method of claim 16, wherein the amount X is between 2% and 50% by weight.

18. The method of claim 15, wherein the first insulating layer is formed by one of a coating method and a CVD method.

19. The method of claim 15, wherein the first insulating layer comprises at least one of $SiO_2$, HSQ, USG, BPSG, and PSG.

20. The method of claim 15, wherein a thickness of the first patterning depth is equal to or more than a thickness of the second insulating layer.

21. The method of claim 15, wherein the contact holes are located in the copper lines.

22. The method of claim 15, wherein the contact holes and the copper lines overlap 10 to 99% of the contact hole diameter.

23. The method of claim 15, wherein the diameter of the contact holes is larger than the width of the copper lines.

24. The method of claim 15, wherein a condition of the etch process during formation of the dual damascene layer is the pressure of etch process is 2~300 mT, the carrier gas includes at least one of $N_2$, Ar, He, and $H_2$, and the etchant gas is $C_xH_yz$, where is between one and five, y is between zero and four, and z is between one and eight.

25. The method of claim 24, wherein the etch process additionally uses CO or $O_2$.

26. The method of claim 24, wherein the etch process is one of an HDP method or an RIE method or an ME-RIE method.

27. The method of claim 15, where conductive lines are formed over contact holes.

28. The method of claim 15, wherein the step of providing a semiconductor substrate having a plurality of copper lines comprises:
    forming a dielectric layer on the semiconductor substrate;
    forming a plurality of grooves in said dielectric layer;
    depositing copper in said grooves and on a portion of said dielectric layer; and
    planarizing said dielectric layer by removing an upper portion of dielectric layer.

29. An etching process for use during a semiconductor manufacturing comprising forming a barrier layer on a semiconductor substrate, forming over the barrier layer a dielectric layer having a slower etching rate at a lower portion thereof relative to the etching rate of an upper portion of the dielectric layer, and etching the upper portion of the dielectric layer using the material at the lower portion to retard an etching rate at the lower portion of the dielectric layer.

30. The etching process as recited in claim 29, wherein said dielectric layer comprises first and second layers, and the first layer has a material having at least one of an Si—C, Si—O—C, Si—CH, Si—$CH_2$, and Si—$CH_3$ bond.

31. The method recited in claim 30, wherein the amount of a material having at least one of an Si—C, Si—O—C, Si—CH, Si—$CH_2$, and Si—$CH_3$ bond in lower portion of the dielectric layer is between 2% and 50% by weight.

32. A method for forming metal interconnection in a semiconductor device, comprising the steps of:
    depositing a first insulating layer having a low dielectric constant as a lower insulating interlayer over a semiconductor substrate provided with a lower metal interconnection layer;
    depositing a second insulating layer having a low dielectric constant and a faster etching speed than said first insulating layer as an upper insulating interlayer over said lower insulating interlayer;
    etching said upper and lower insulating interlayers according to a first photoresist pattern to produce contact holes for exposing said lower metal interconnection layer;
    removing said first photoresist pattern; and
    etching said upper insulating interlayer with selectivity to said lower insulating interlayer according to a second photoresist pattern to produce at least one trench for forming an upper metal interconnection layer.

33. The method according to claim 32, further including the steps of:
    removing said second photoresist pattern; and
    filling said contact hole and trench to form said upper metal interconnection layer.

34. The method as in claim 32, wherein said first insulating layer consists of an organic or inorganic substance with hydrogen radical (–H) or bond with a carbon compound.

35. The method as in claim 32, wherein said second insulating layer is formed from an inorganic substance without hydrogen radical and bond with a carbon compound.

36. The method as in claim 32, wherein the step of etching said upper insulating layer with selectivity to the lower insulating interlayer is performed by using a plasma gas of $C_xF_y$ series with a high C/F ratio, a mixture of $C_xF_y/CH_xF_y$ series, or $C_xF_y$ or $CH_xF_y/C_xF_y$ series mixed with at least one of $O_2N_2$, or CO.

37. The method as claimed in claim 32, wherein the second insulating layer has a dielectric constant of equal or less than 4.

38. The method as claimed in claim 33, wherein the first insulating layer has a dielectric constant of equal or less than 3.

39. A method of performing a damascene process in a semiconductor manufacturing process comprising:

provviding a semiconductor substrate that includes a plurality of contact structures within said substrate;

forming a first dielectric layer on the substrate;

forming a second dielectric layer on the first dielectric layer, the second dielectric layer having a highter etching rate relative to the etching rate of the first dielectric layer;

forming a photoresist pattern on the second dielectric layer;

patterning the photoresist pattern and etching the second dielectric layer to expose portions of the first insulating layer overlaying the contact structures, removing the photresist pattern thereby to form a damascene pattern in the first and second layers, and filling the damascene pattern with a conductive material whereby to provide an electrical connection with the contact structure.

40. The method as recited in claim 39, wherein the higher and lower etching rates are obtained by differing amounts of a material of the first and second dielectric layers having at least one of an Si-C, Si-O-C, and an Si-$CH_x$ bond.

41. The method as recited in claim 40, wherein the material of the first dielectric layer is Si-O-C.

42. The method as recited on claim 40, wherein the amount of material having at least the one of an Si-C, Si-O-C, and an Si-$CH_x$ bond in the first dielectric layer is between 5% and 50% by weight.

43. The method of claim 40, wherein the first dielectric layer is formed by one of a spin-on-dielectric (SOD) process and a chemical vapor deposition (CVD) process.

44. The method of claim 40, wherein the second dielectric layer comprises one of a Si)2, HSQ, USG, BPSG, BSG, and PSG layer.

45. The method of claim 40, wherein a thickness of the first patterning depth is equal to or more than a thickness of the second dielectric layer.

46. The method of claim 40, wherein the etch process comprises one of a high density plasma (HDP) method, a reactive ion etcing (RIE) method, and a magnetic-enhanced RIE method.

* * * * *